United States Patent
Okano (10) Patent No.: US 8,237,226 B2
(45) Date of Patent: Aug. 7, 2012

(54) SEMICONDUCTOR DEVICE AND METHOD OF FABRICATING THE SAME

(75) Inventor: Kimitoshi Okano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/421,143

(22) Filed: Apr. 9, 2009

(65) Prior Publication Data

US 2009/0256208 A1 Oct. 15, 2009

(30) Foreign Application Priority Data

Apr. 11, 2008 (JP) ................................ 2008-103850

(51) Int. Cl.
*H01L 21/70* (2006.01)
(52) U.S. Cl. .................. 257/368; 438/585; 257/E29.264
(58) Field of Classification Search .................. 257/365, 257/368, E29.264; 438/142, 585
See application file for complete search history.

(56) References Cited

U.S. PATENT DOCUMENTS

| | | | |
|---|---|---|---|
| 6,611,029 B1 | 8/2003 | Ahmed et al. | |
| 6,867,433 B2 * | 3/2005 | Yeo et al. | 257/67 |
| 7,271,456 B2 * | 9/2007 | Oh et al. | 257/401 |
| 7,728,324 B2 * | 6/2010 | Tezuka et al. | 257/29 |
| 2004/0075122 A1 | 4/2004 | Lin et al. | |
| 2008/0099834 A1 * | 5/2008 | Willer | 257/330 |
| 2008/0296632 A1 * | 12/2008 | Moroz et al. | 257/255 |
| 2009/0008705 A1 * | 1/2009 | Zhu et al. | 257/327 |
| 2009/0085027 A1 * | 4/2009 | Jin et al. | 257/24 |
| 2009/0085062 A1 * | 4/2009 | Jin et al. | 257/190 |
| 2009/0140294 A1 * | 6/2009 | Adhikari et al. | 257/192 |
| 2010/0127327 A1 * | 5/2010 | Chidambarrao | 257/347 |

FOREIGN PATENT DOCUMENTS

| | | |
|---|---|---|
| JP | 2006-504267 | 2/2006 |
| JP | 2006-505950 | 2/2006 |

OTHER PUBLICATIONS

Masumi Saitoh et al., "Three-Dimensional Stress Engineering in FinFETs for Mobility/On-Current Enhancement and Gate Current Reduction", 2008 Symposium on VLSI Technology Digest of Technical Papers, 2008, pp. 18-19.
T. Kanemura et al., "Improvement of Drive Current in Bulk-FinFET using Full 3D Process/Device Simulations", SISPAD, 2006, 4 pages.
Jack Kavalieros et al., "Tri-Gate Transistor Architecture with High-k Gate Dielectrics, Metal Gates and Strain Engineering", Online Intel Group, Jun. 2006, 2 pages.

* cited by examiner

*Primary Examiner* — William D Coleman
*Assistant Examiner* — Christine Enad
(74) *Attorney, Agent, or Firm* — Oblon, Spivak, McClelland, Maier & Neustadt, L.L.P.

(57) ABSTRACT

A method of fabricating a semiconductor device according to one embodiment includes: forming a fin and a film on a semiconductor substrate, the film being located at least either on the fin or under the fin and on the semiconductor substrate; forming a gate electrode so as to sandwich both side faces of the fin via a gate insulating film; and expanding or shrinking the film, thereby generating a strain in a height direction of the fin in a channel region.

18 Claims, 10 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2008-103850, filed on Apr. 11, 2008, the entire contents of which are incorporated herein by reference.

BACKGROUND

In a conventional fin-type transistor, there is known a technique in which, when a plane direction of a channel region formed on side faces of a fin of an n-type transistor is (110) and a direction of electrical current is <1-10>, carrier (electron) mobility in the channel region is improved by generating a compressive strain in a height direction (<001> direction) in the fin.

BRIEF SUMMARY

A method of fabricating a semiconductor device according to one embodiment includes: forming a fin and a film on a semiconductor substrate, the film being located at least either on the fin or under the fin and on the semiconductor substrate; forming a gate electrode so as to sandwich both side faces of the fin via a gate insulating film; and expanding or shrinking the film, thereby generating a strain in a height direction of the fin in a channel region.

A method of fabricating a semiconductor device according to another embodiment includes: forming a fin, a pad connected to the fin and a film on a semiconductor substrate, the film being located at least either on or under the fin and the pad; expanding or shrinking a portion of the film that is located on an interface with the fin and on a portion of outside of an interface with the pad, thereby generating a strain in a height direction of the fin in the fin; and forming a gate electrode so as to sandwich both side faces of the fin via gate insulating films.

A semiconductor device, comprising: a fin formed on a semiconductor substrate and having a strain in a height direction in a channel region therein; a gate electrode formed so as to sandwich both side faces of a portion of the fin including the channel region; and a film formed at least either on or under a portion of the fin including the channel region, the film configured to generate a strain to the portion of the fin.

DETAILED DESCRIPTION

First Embodiment

Structure of Semiconductor Device

Figure 1:
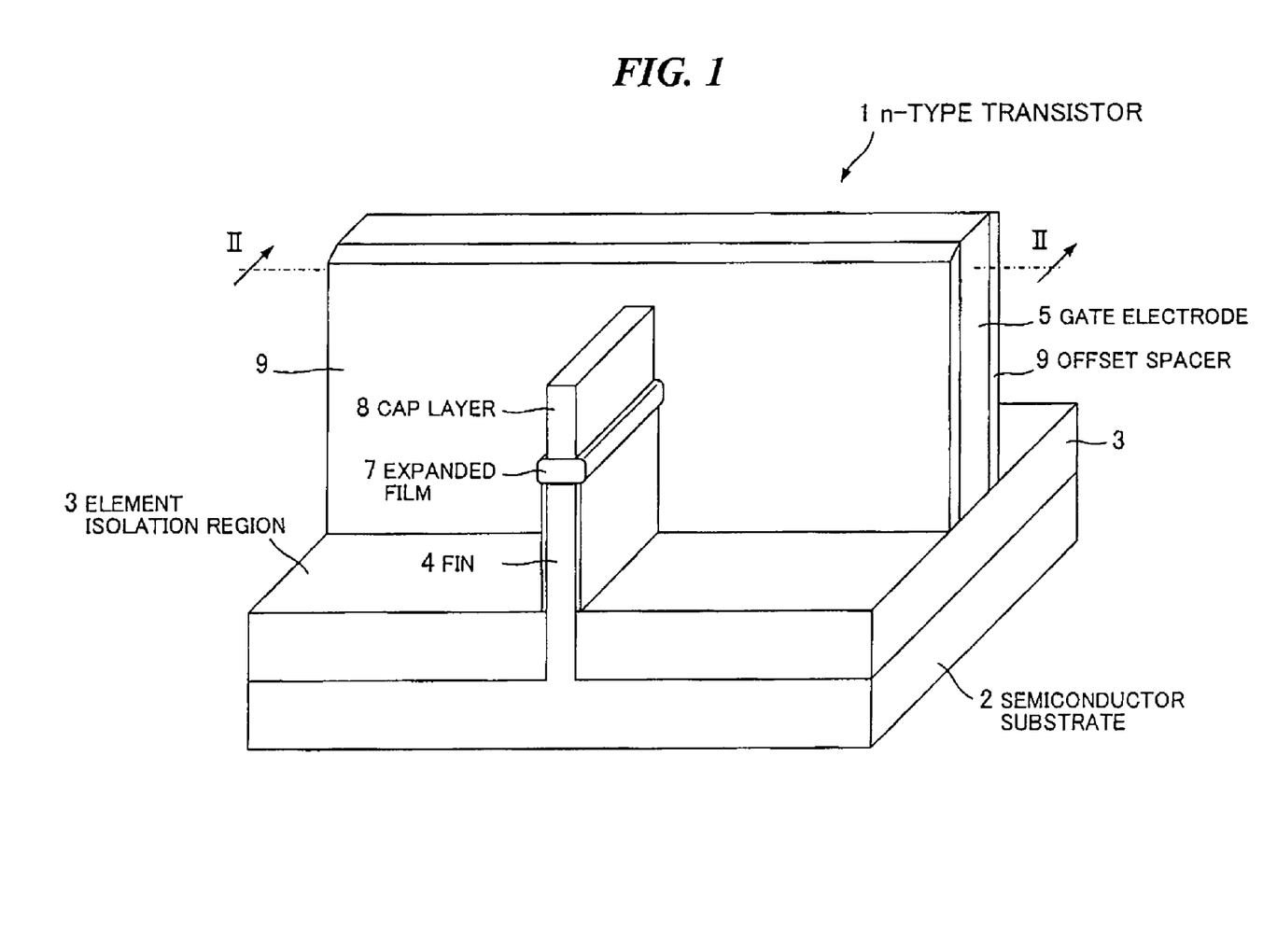
FIG. 1 is a perspective view showing a semiconductor device according to a first embodiment.
Figure 2A:
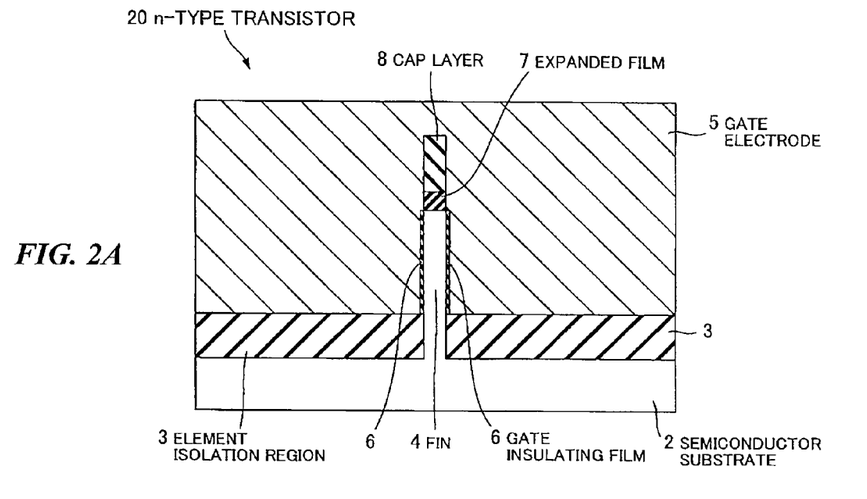
FIGS. 2A and 2B are a cross sectional view when a cut surface taken on line II-II of FIG. 1 is viewed in a direction indicated by an arrow and a partial enlarged view thereof.
Figure 2B:
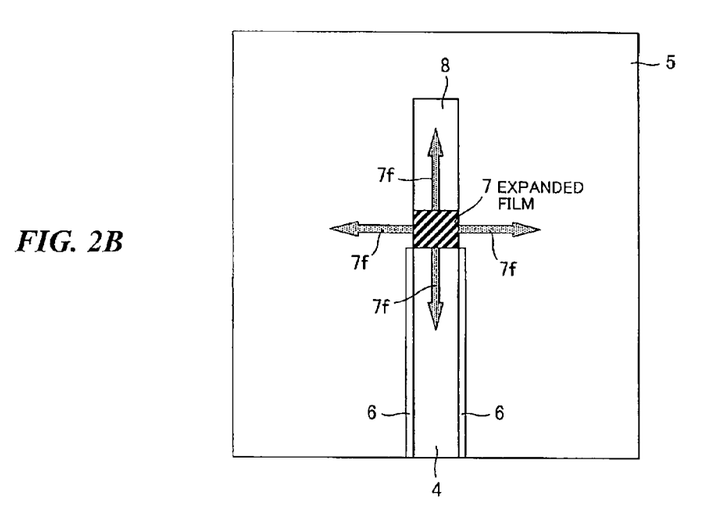

FIG. 1 is a perspective view showing a semiconductor device according to a first embodiment. In addition, FIG. 2A is a cross sectional view when a cut surface taken on line II-II of FIG. 1 is viewed in a direction indicated by an arrow and FIG. 2B is a partial enlarged view of FIG. 2A.

A semiconductor device according to the present embodiment has an n-type transistor 1 schematically configured to have a semiconductor substrate 2, an element isolation region 3, a fin 4 formed on the semiconductor substrate 2, a gate electrode 5 formed so as to sandwich both side faces of the fin 4 via gate insulating films 6, an expanded film 7 formed on the fin 4, a cap layer 8 formed on the expanded film 7, and offset spacers 9 formed on side faces of the gate electrode 5.

For the semiconductor substrate 2, it is possible to use, e.g., a Si substrate of which plane direction of the principal surface is {100}. Note that, {100} represents (100) and a plane direction equivalent to (100).

The element isolation region 3 is made of, e.g., an insulating material such as $SiO_2$, etc., and has a STI (Shallow Trench Isolation) structure.

The fin 4 is formed by, e.g., shaping the semiconductor substrate 2. In addition, the fin 4 includes n-type source and drain regions (not shown). A region in the fin 4, which is surrounded by the gate electrode 5 and is sandwiched by the source region and the drain region, functions as a channel region.

The gate electrode 5 is made of, e.g., a Si-based polycrystalline such as polycrystalline Si or polycrystalline SiGe, etc., containing a conductivity type impurity. An n-type impurity such as As or P, etc., is used for the conductivity type impurity. Alternatively, the gate electrode 5 may be a metal gate electrode made of W, Ta, Ti, Hf, Zr, Ru, Pt, Ir, Mo or Al, etc., or a compound thereof, etc. Furthermore, the gate electrode 5 may have a laminated structure in which Si-based polycrystalline containing a conductivity type impurity is formed on the metal gate electrode. In addition, when an upper portion of the gate electrode 5 is made of a Si-based polycrystalline, a silicide layer may be formed on an upper surface thereof.

The gate insulating film 6 is made of, e.g., $SiO_2$, SiN, SiON, or a high-k material (e.g., an Hf-based material such as HfSiON, HfSiO or HfO, etc., a Zr-based material such as ZrSiON, ZrSiO or ZrO, etc., and a Y-based material such as $Y_2O_3$, etc.).

The expanded film 7 is a film of which volume is expanded by applying a predetermined treatment to a precursor film. As a precursor film of the expanded film 7, it is possible to use, e.g., a material having an oxidation rate faster than that of a crystal composing the fin 4, and when the fin 4 is made of a Si crystal, it is possible to use a material having an oxidation rate faster than that of a Si crystal such as a $Si_{1-x}Ge_x$ ($0<x\leq1$) crystal (hereinafter referred to as a SiGe crystal). In this case, the volume of the SiGe crystal is expanded by applying oxidation treatment thereto, which results in that a SiGe oxide (mixture of Si oxide and Ge oxide) film as the expanded film 7 is formed.

As shown in FIG. 2B, the expanded film 7 applies a pushing force 7f to peripheral members by the expansion thereof. As a result, the fin 4 receives a downward external force and a compressive strain in a height direction thereof is generated.

For example, when a plane direction of a channel region formed on the side face of the fin 4 is {110} and a direction of electrical current is <1-10>, it is possible to improve carrier (electron) mobility in the channel region by generating a compressive strain in a height direction (<001> direction) in the fin 4. Note that, in case that a p-type transistor having the same structure as the n-type transistor 1 is fabricated instead of the n-type transistor 1, according to the knowledge of the assignee, it is possible to improve carrier (hole) mobility in the channel region by generating a compressive strain in a height direction (<001> direction) in the fin 4 when a plane direction of the channel region formed on the side face of the fin 4 is {100} and a direction of electrical current is <010>. Note that, <110> represents [110] and a direction equivalent to [110].

The expanded film 7 is formed for generating a compressive strain in a height direction of the fin 4 in the channel region, and is formed on at least a portion of the fin 4 including the channel region (a region sandwiched by the gate electrode 5). In order to generate a strain more effectively, it is preferable that the expanded film 7 is formed so as to cover the whole upper surface of the fin 4 as shown in FIG. 1.

The cap layer 8 is made of an insulating material such as SiN, etc. In addition, the cap layer 8 is preferably formed so as to cover the whole upper surface of the expanded film 7. This is because an upward force 7f generated from the expanded film 7 is received by the cap layer 8 without being diffused, and thus, a downward force 7f is effectively transmitted to the fin 4.

The offset spacer 9 is made of, e.g., $SiO_2$ or SiN, etc. Alternatively, gate sidewalls made of an insulating material may be formed on side faces of the offset spacers 9. Note that, the offset spacer 9 also has a function of suppressing reduction of the external force to the fin 4 generated by the expansion of the expanded film 7.

An example of a method of fabricating a semiconductor device according to the present embodiment will be described hereinafter.

(Fabrication of Semiconductor Device)

FIGS. 3A to 3F are perspective views showing processes for fabricating the semiconductor device according to the first embodiment.

Figure 3A:
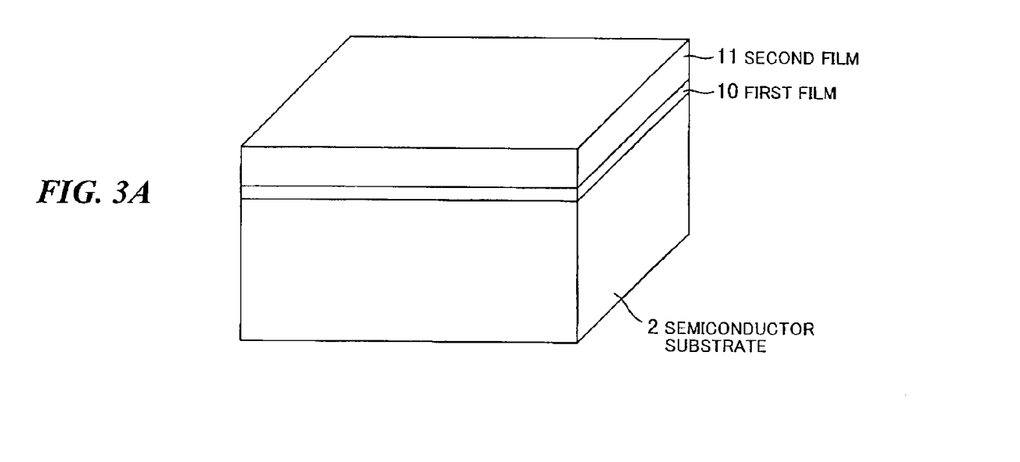
FIGS. 3A to 3F are perspective views showing processes for fabricating the semiconductor device according to the first embodiment.

Firstly, as shown in FIG. 3A, a first film 10 to be a precursor film of the expanded film 7 and a second film 11 to be shaped into the cap layer 8 are laminated on the semiconductor substrate 2.

When a SiGe crystal film is formed as the first film 10, the SiGe crystal film is formed by a vapor phase epitaxial growth under temperature conditions of 700-850° C. using monosilane ($SiH_4$), dichlorosilane ($SiH_2Cl_2$) or trichlorosilane ($SiHCl_3$), etc., as a raw material of Si and germanium hydride ($GeH_4$) as a raw material of Ge in an atmosphere of hydrogen gas, etc. Meanwhile, when a SiN film is formed as the second film 11, a CVD (Chemical Vapor Deposition), etc., is used.

Figure 3B:
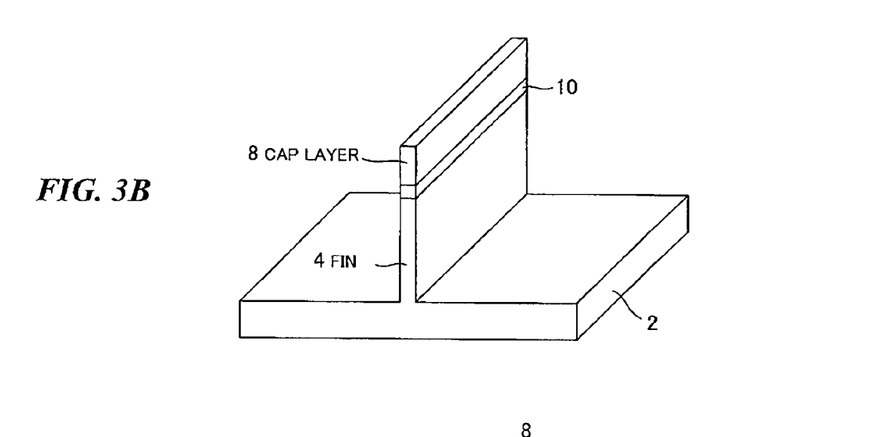

Next, as shown in FIG. 3B, the second film 11, the first film 10 and the semiconductor substrate 2 are patterned by, e.g., a photolithography method and RIE (Reactive Ion Etching), thereby forming the fin 4 which has the first film 10 and the cap layer 8 shaped from the second film 11 on an upper portion thereof.

Figure 3C:
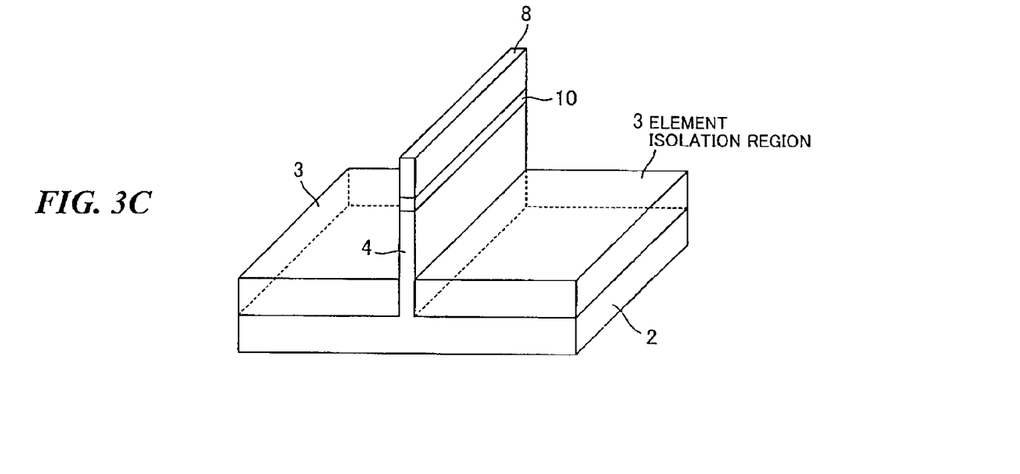

Next, as shown in FIG. 3C, the element isolation region 3 is formed. After depositing an insulating film made of $SiO_2$, etc., on the semiconductor substrate 2 by the CVD method, etc., so as to be higher than the height of the upper surface of the cap layer 8, planarizing treatment such as CMP (Chemical Mechanical Polishing), etc., is applied to the insulating film using the upper surface of the cap layer 8 as a stopper, and the insulating film is further etched back by the RIE, etc., which results in that the element isolation region 3 is formed.

Figure 3D:
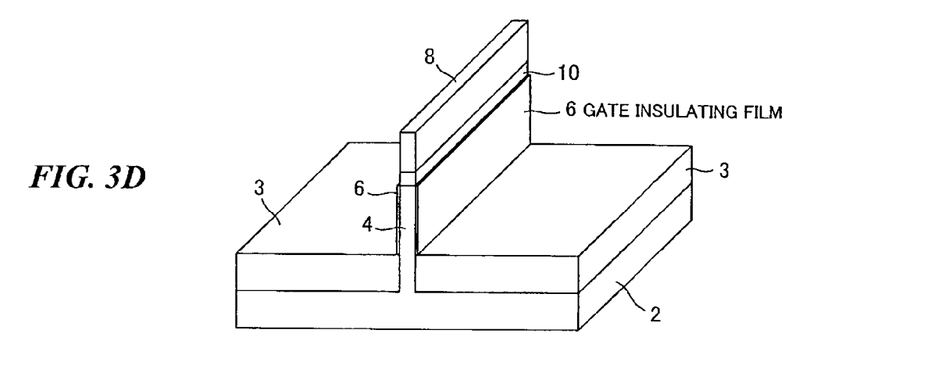

Next, as shown in FIG. 3D, the gate insulating film 6 is formed on the exposed side face of the fin 4. For example, the gate insulating film 6 is formed by applying oxidation treatment to the side face of the fin 4 when using a $SiO_2$ film as the gate insulating film 6, and is formed by applying nitriding treatment or oxynitriding treatment after applying the oxidation treatment on the side face of the fin 4 when using a SiON film. In addition, when a SiN film or a high-k material, etc., is used as the gate insulating film 6, after depositing a SiN film or a high-k material film on the whole surface of the semiconductor substrate 2 by the CVD method, etc., the gate insulating film 6 may be formed by removing an unnecessary portion of such films.

Note that, since the side face of the first film 10 is also oxidized in the similar way when the oxidation treatment is applied to the side face of the fin 4 during the formation of the gate insulating film 6, an oxidation rate of the first film 10 is desirably slower than that of Si. At this time, it is possible to reduce the degree of oxidation of the side face of the first film 10 by applying radical oxidation treatment using radical oxygen.

Figure 3E:
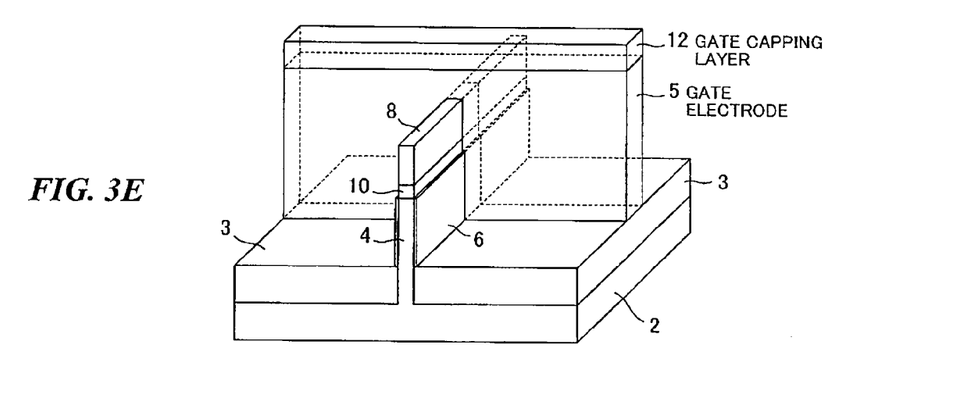

Next, as shown in FIG. 3E, the gate electrode 5 having a gate capping layer 12 on the upper surface thereof is formed.

The gate electrode 5 and the gate capping layer 12 are formed by, e.g., following processes. Firstly, after depositing a material film of the gate electrode 5 such as a polycrystalline Si film, etc., on the semiconductor substrate 2 using the CVD method, etc., the material film is planarized by the CMP, etc. Next, a material film of the gate capping layer 12 such as SiN or $SiO_2$, etc., is deposited on the planarized material film of the gate electrode 5. Next, the material film of the gate electrode 5 and the material film of the gate capping layer 12 are patterned using, e.g., the photolithography method and the RIE method, which results in that the gate electrode 5 and the gate capping layer 12 are formed.

Figure 3F:
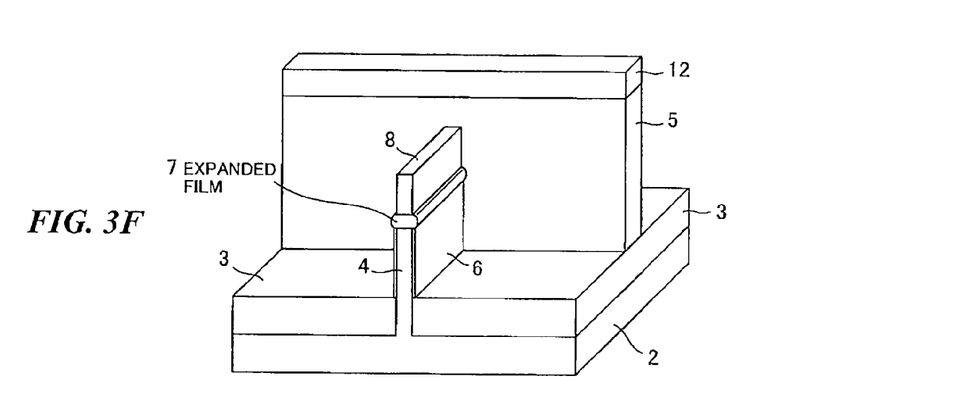

Next, as shown in FIG. 3F, the oxidation treatment is applied to the first film 10 for expanding the volume thereof, which results in that the expanded film 7 is formed. For example, when the first film 10 is a SiGe crystal film, the expanded film 7 is a SiGe oxide film. At this time, since an expansion of a portion of the first film 10 of which periphery is surrounded by the gate electrode 5 is disturbed by the gate electrode 5, a force 7f applied to peripheral members becomes particularly large. Therefore, although the expanded film 7 can be formed before forming the gate electrode 5 and after forming the cap layer 8, a strain generated in the fin 4 becomes larger when the expanded film 7 is formed after forming the gate electrode 5.

Figure 4A:
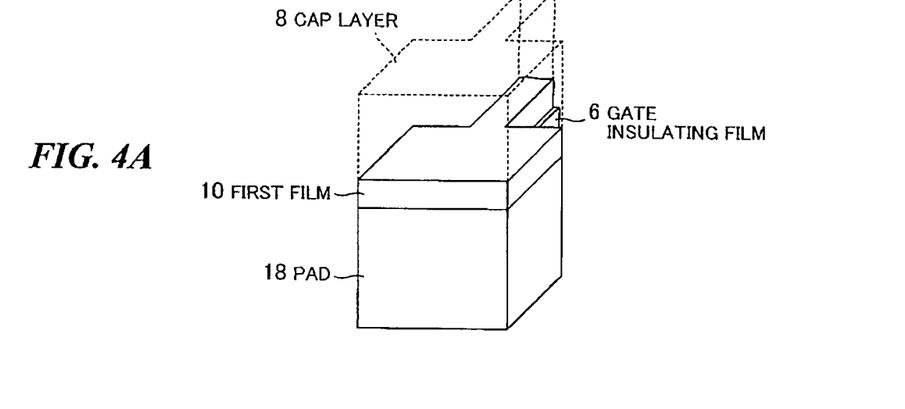
FIGS. 4A, 4B and 4C are partial perspective views and a schematic top view showing the semiconductor device according to the first embodiment.
Figure 4B:
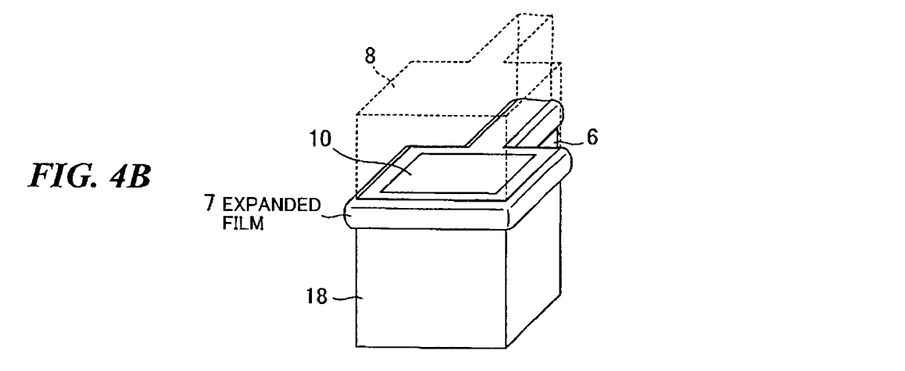
Figure 4C:
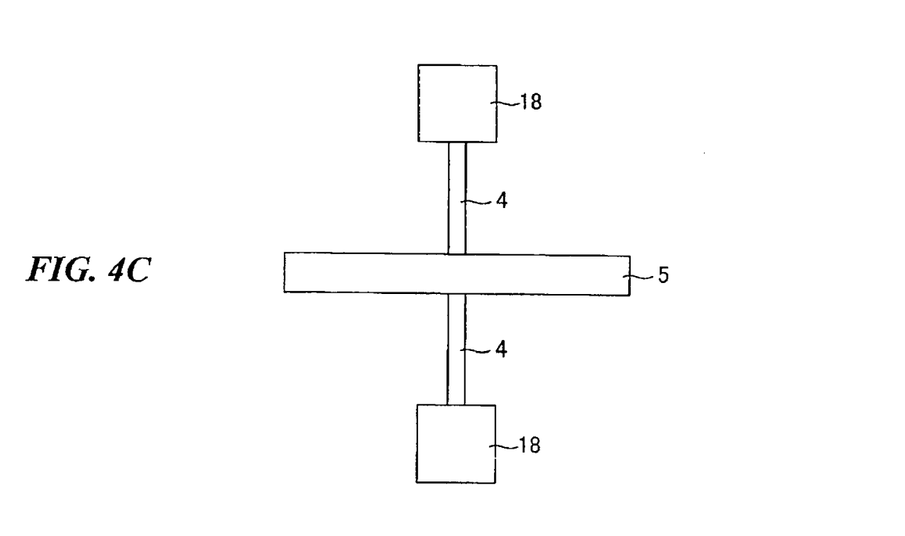

Note that, the fin 4 may be connected to a pad which is a connection region of a contact plug connected to a source region and a drain region in the fin 4. FIGS. 4A and 4B are partial enlarged views showing a periphery of a pad 18 formed at an end of the fin 4 each before and after the formation of the expanded film 7 in such cases. FIG. 4C is a top view schematically showing a positional relation among the fin 4, the pad 18 and the gate electrode 5. Note that, when plural fins 4 are formed in parallel, the plural fins 4 may be connected to one pad.

The pad is, e.g., formed of the same material as and integrally with the fin 4. Since a width of the upper surface of the pad 18 is larger than that of the fin 4, only the first film 10 which is located on the fin 4 and the periphery of the pad 18 can be oxidized and processed into the expanded film 7. Here, if the entire first film 10 becomes the expanded film 7 and expands, all members above the expanded film 7 are lifted upward when the oxidation treatment is applied to the first film 10 before forming the gate electrode 5, the force 7f applied to the peripheral members is reduced. However, since the first film 10 located on the vicinity of the center of the upper surface of the pad 18 is not oxidized and does not expand, even when the expanded film 7 is formed before forming the gate electrode 5, the reduction of the force 7f applied to the peripheral members by the expansion of the expanded film 7 can be suppressed, and it is thus possible to generate a strain in the fin 4 by the expanded film 7.

Note that, when the first film 10 is a SiGe crystal film, since it is possible to increase the oxidation rate of the SiGe crystal by applying the oxidation treatment to the first film 10 using burning oxidation, it is possible to form the expanded film 7 while suppressing the oxidation that reaches the fin 4 made of a Si crystal, etc., low. Here, the burning oxidation is oxidation treatment using $H_2O$ which is produced by an oxidation of $H_2$. Alternatively, in order to facilitate the progress of the oxidation reaction of the first film 10, the oxidation treatment may be applied to the first film 10 after removing a portion of the cap layer 8 not covered by the gate electrode 5. Furthermore, although it is preferable that a portion of the first film 10 of which periphery is surrounded by the gate electrode 5 is entirely oxidized for effectively generating a strain in the fin 4, an unreacted region may be partially remained.

For example, a portion which is apart from the exposed surface of the Fin is less oxidized than a portion near to the exposed surface of the Fin. It may be possible that a portion above the channel in the Fin may be not oxidized, since the portion is apart from the exposed surface of the Fin.

After this, the offset spacers 9 are formed on the side face of the gate electrode 5, the gate capping layer 12 is removed, and a source region and a drain region are formed in the fin 4. In the source region and the drain region, for example, after forming source/drain extension regions by an ion implantation procedure, etc., using the offset spacers 9 as a mask, gate sidewalls are formed on the side faces of the offset spacers 9, and deep source/drain regions are formed using the gate sidewalls as a mask. After that, a wiring, etc., is formed in an upper layer.

According to the first embodiment, it is possible to apply an external force to the channel region in the fin 4 by forming the expanded film 7, thereby generating a compressive strain in a height direction of the fin 4 in the channel region. As a result, electron mobility in the channel region is improved, hence, an operating speed of the n-type transistor 1 is improved.

Second Embodiment

The second embodiment is different from the first embodiment in that an operating speed of a p-type transistor is improved. Note that, the explanation will be omitted for the points same as the first embodiment.
(Structure of Semiconductor Device)

Figure 5A:
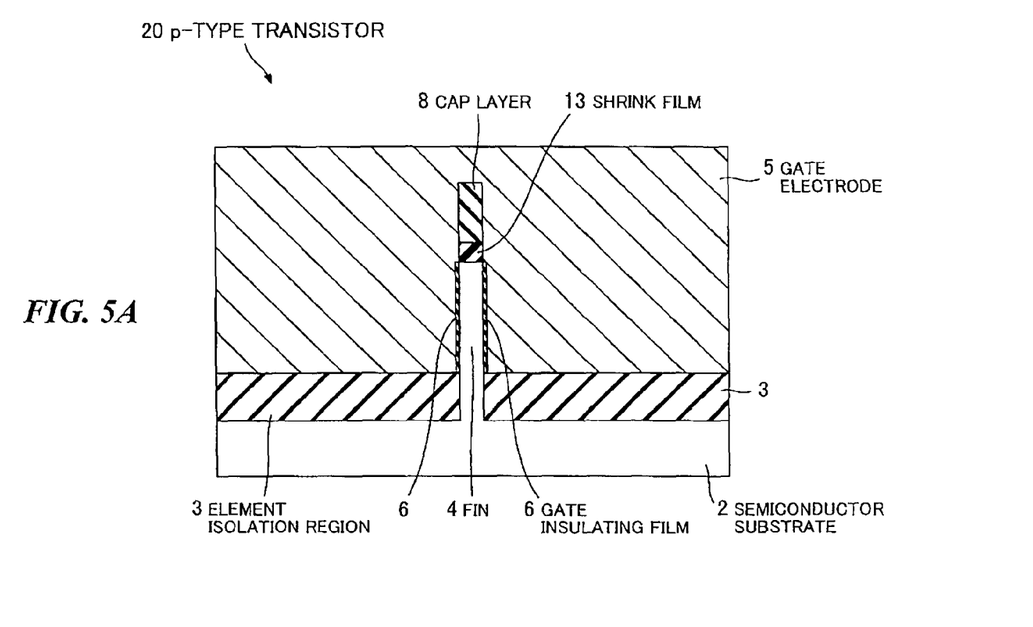
FIGS. 5A and 5B are a cross sectional view showing a semiconductor device according to a second embodiment and a partial enlarged view thereof.
Figure 5B:
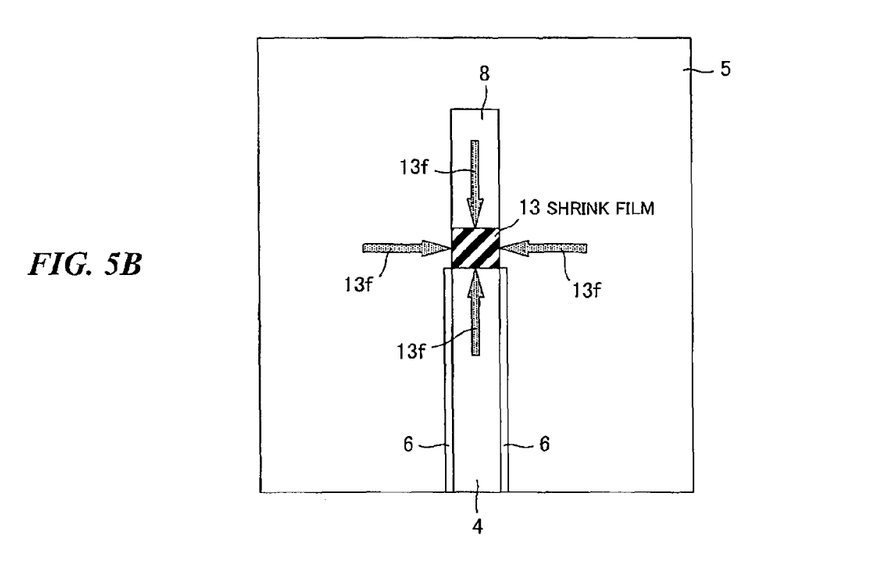

FIG. 5A is a cross sectional view showing a semiconductor device according to a second embodiment. In addition, FIG. 5B is a partial enlarged view of FIG. 5A. Note that, the cross sections shown in FIGS. 5A and 5B correspond to the cross sections of the semiconductor device according to the first embodiment shown in FIGS. 2A and 2B.

A semiconductor device according to the present embodiment has a p-type transistor 20 schematically configured to have a semiconductor substrate 2, an element isolation region 3, a fin 4 formed on the semiconductor substrate 2, a gate electrode 5 formed so as to sandwich both side faces of the fin 4 via gate insulating films 6, a shrink film 13 formed on the fin 4, a cap layer 8 formed on the shrink film 13, and offset spacers (not shown) formed on side faces of the gate electrode 5.

The p-type transistor 20 has a structure in which the shrink film 13 is formed instead of the expanded film 7 in the n-type transistor 1 according to the first embodiment.

The gate electrode 5 is made of, e.g., a Si-based polycrystalline such as polycrystalline Si or polycrystalline SiGe, etc., containing a conductivity type impurity. A p-type impurity such as B or $BF_2$, etc., is used for the conductivity type impurity. Alternatively, the gate electrode 5 may be a metal gate electrode made of W, Ta, Ti, Hf, Zr, Ru, Pt, Ir, Mo or Al, etc., or a compound thereof, etc. Furthermore, the gate electrode 5 may have a laminated structure in which Si-based polycrystalline containing a conductivity type impurity is formed on the metal gate electrode. In addition, when an upper portion of the gate electrode 5 is made of a Si-based polycrystalline, a silicide layer may be formed on an upper surface thereof.

The shrink film 13 is a film of which volume is shrunk by applying a predetermined treatment to a precursor film. For example, the volume is shrunk by applying heat treatment to an ozone TEOS film, which results in that a Si oxide film as the shrink film 13 is formed. Here, the ozone TEOS film is a $SiO_2$ film formed by the CVD method using $O_3$ (ozone) and TEOS as a raw material gas.

As shown in FIG. 5B, the shrink film 13 applies a pulling force 13f to peripheral members by the shrinkage thereof. As a result, the fin 4 receives an upward external force and a tensile strain in a height direction thereof is generated.

For example, according to the knowledge of the assignee, it is possible to improve carrier (hole) mobility in the channel region by generating a tensile strain in a height direction (<001> direction) in the fin 4 when a plane direction of the channel region formed on the side face of the fin 4 is {110} and a direction of electrical current is <1-10>.

The shrink film 13 is formed for generating a tensile strain in a height direction of the fin 4 in the channel region in the fin 4, and is formed on at least a portion of the fin 4 including the channel region (a region sandwiched by the gate electrode 5). Particularly, in order to generate a strain more effectively, it is preferable that the shrink film 13 is formed so as to cover the whole upper surface of the fin 4.

An example of a method of fabricating a semiconductor device according to the present embodiment will be described hereinafter.
(Fabrication of Semiconductor Device)

Firstly, the processes until the process, shown in FIG. 3E, for forming the gate electrode 5 having the gate capping layer 12 on the upper surface thereof are carried out in the same way as the first embodiment. In this regard, however, a precursor film of the shrink film 13 is formed instead of the first film 10 in the first embodiment.

For example, when an ozone TEOS film is formed as a precursor film of the shrink film 13, the ozone TEOS film is formed by the CVD method using an $O_3$ gas and a TEOS gas.

Next, volume of the precursor film of the shrink film 13 is shrunk by heat treatment, which results in that the shrink film 13 is formed. For example, when the precursor film of the shrink film 13 is an ozone TEOS film, the shrink film 13 is a Si oxide film. Subsequent processes are same as the first embodiment.

Note that, since a shrinkage of a portion of the precursor film of the shrink film 13 of which periphery is surrounded by the gate electrode 5 is disturbed by the gate electrode 5, a force applied to peripheral members becomes particularly large. Therefore, similarly to the first embodiment, the shrink film 13 is preferably formed after forming the gate electrode 5.

However, the shrinking process may be provided before forming the gate electrode 5 and after forming the cap layer 8.

According to the second embodiment, it is possible to apply an external force to the channel region in the fin 4 by forming the shrink film 13, thereby generating a tensile strain in a height direction of the fin 4 in the channel region. As a result, hole mobility in the channel region is improved, hence, an operating speed of the p-type transistor 20 is improved.

Third Embodiment

The third embodiment is different from the first embodiment in that expanded films are formed on and under the fin. Note that, the explanation will be omitted for the points same as the first embodiment.

(Structure of Semiconductor Device)

Figure 6A:
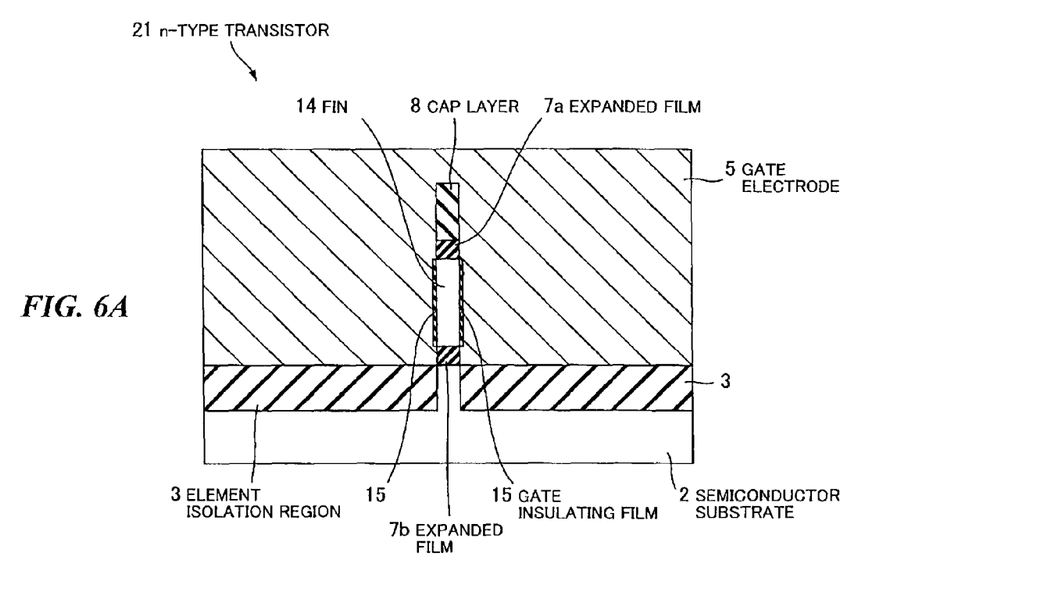
FIGS. 6A and 6B are a cross sectional view showing a semiconductor device according to a third embodiment and a partial enlarged view thereof.
Figure 6B:
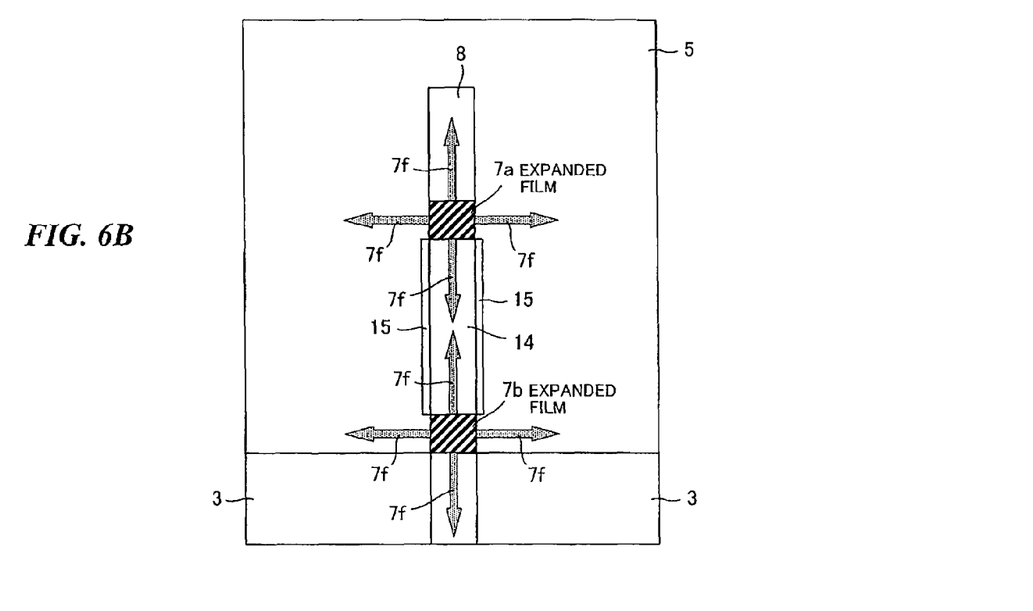

FIG. 6A is a cross sectional view showing a semiconductor device according to a third embodiment. In addition, FIG. 6B is a partial enlarged view of FIG. 6A. Note that, the cross sections shown in FIGS. 6A and 6B correspond to the cross sections of the semiconductor device according to the first embodiment shown in FIGS. 2A and 2B.

A semiconductor device according to the present embodiment has an n-type transistor 21 schematically configured to have a semiconductor substrate 2, an element isolation region 3, a fin 4 formed on the semiconductor substrate 2, a gate electrode 5 formed so as to sandwich both side faces of the fin 14 via gate insulating films 6, expanded films 7a and 7b formed on and under the fin 14, a cap layer 8 formed on the expanded film 7a, and offset spacers (not shown) formed on side faces of the gate electrode 5.

The expanded films 7a and 7b can be formed by the same method using the same material as the expanded film 7 in the first embodiment.

As shown in FIG. 6B, the expanded films 7a and 7b apply a pushing force 7f to peripheral members by the expansion thereof. As a result, the fin 14 receives a downward external force from the expanded film 7a and an upward external force from the expanded film 7b, and a compressive strain in a height direction thereof is generated.

The expanded film 7a is formed for the purpose of generating a compressive strain in a height direction of the fin 14 in the channel region in the fin 14, and is formed on at least a portion of the fin 14 including the channel region (a region sandwiched by the gate electrode 5). In addition, the expanded film 7b is formed under at least a portion of the fin 14 including the channel region (a region sandwiched by the gate electrode 5) for the same reason. Particularly, in order to generate a strain more effectively, it is preferable that the expanded films 7a and 7b are formed so as to cover the whole upper and lower surfaces of the fin 14.

An example of a method of fabricating a semiconductor device according to the present embodiment will be described hereinafter.

(Fabrication of Semiconductor Device)

FIGS. 7A to 7F are perspective views showing processes for fabricating the semiconductor device according to the third embodiment.

Figure 7A:
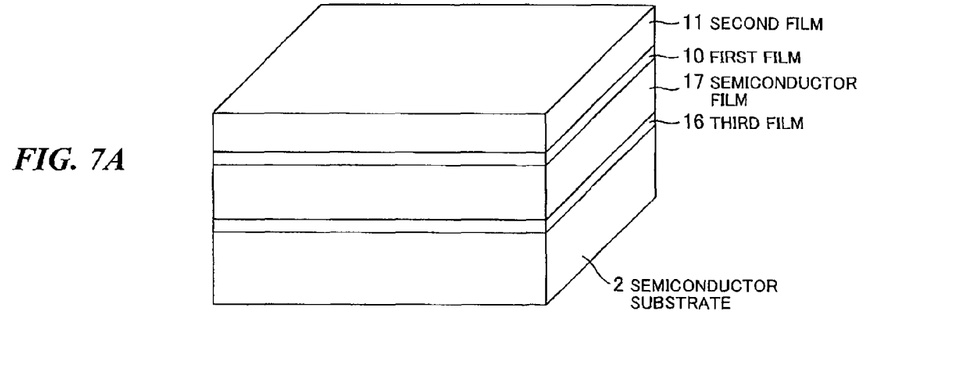
FIGS. 7A to 7F are perspective views showing processes for fabricating the semiconductor device according to the third embodiment.

Firstly, as shown in FIG. 7A, a third film 16 to be a precursor film of the expanded film 7b, a semiconductor film 17 to be shaped into a fin 14, a first film 10 to be a precursor film of the expanded film 7a and a second film 11 to be shaped into the cap layer 8 are laminated on the semiconductor substrate 2.

Figure 7B:
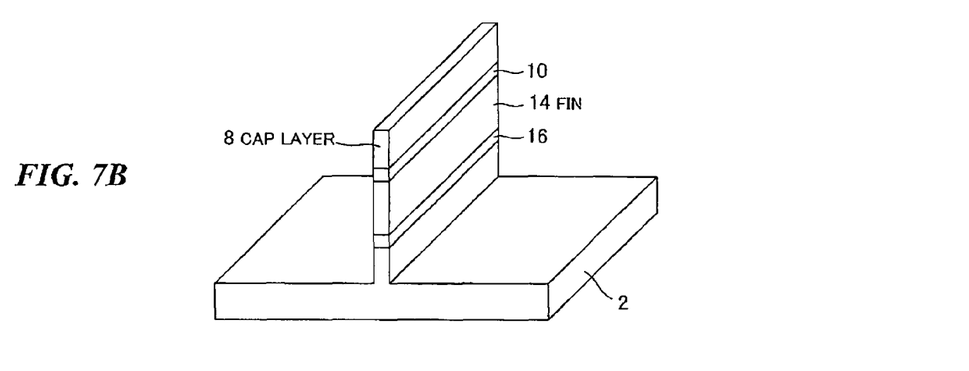

Next, as shown in FIG. 7B, the second film 11, the first film 10, the semiconductor film 17, the third film 16 and the semiconductor substrate 2 are patterned by, e.g., the photolithography method and the RIE, thereby forming the fin 14 having the first film 10 and the cap layer 8 on an upper portion thereof as well as the third film 16 under a lower portion thereof.

Figure 7C:
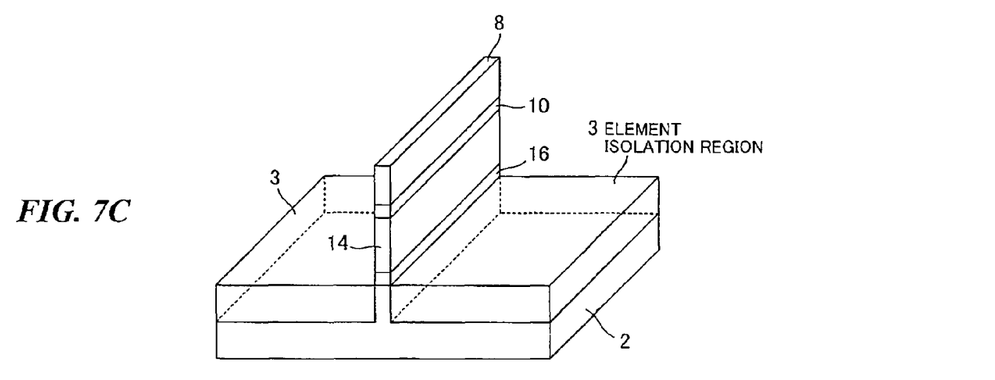

Next, as shown in FIG. 7C, the element isolation region 3 is formed. Here, the element isolation region 3 is formed to a height with which side faces of the third film 16 are not covered so as not to disturb the oxidation treatment to the third film 16 in a posterior process.

Figure 7D:
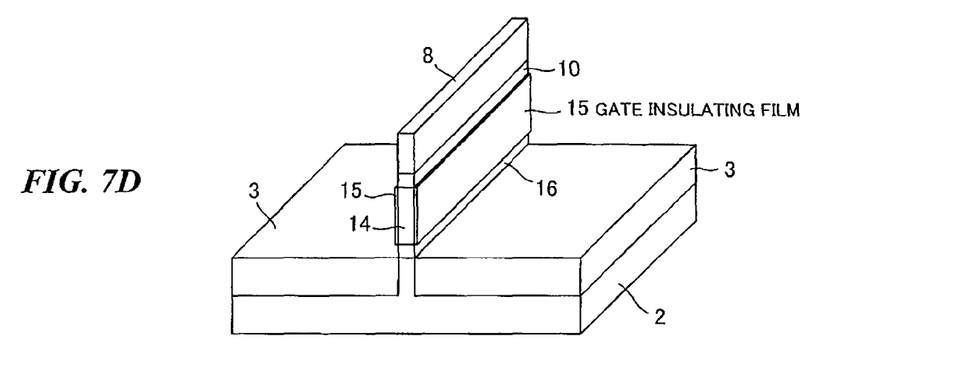

Next, as shown in FIG. 7D, a gate insulating film 15 is formed on the exposed side face of the fin 14. Here, the gate insulating film 15 can be formed by the same method as the gate insulating film 6 in the first embodiment.

Figure 7E:
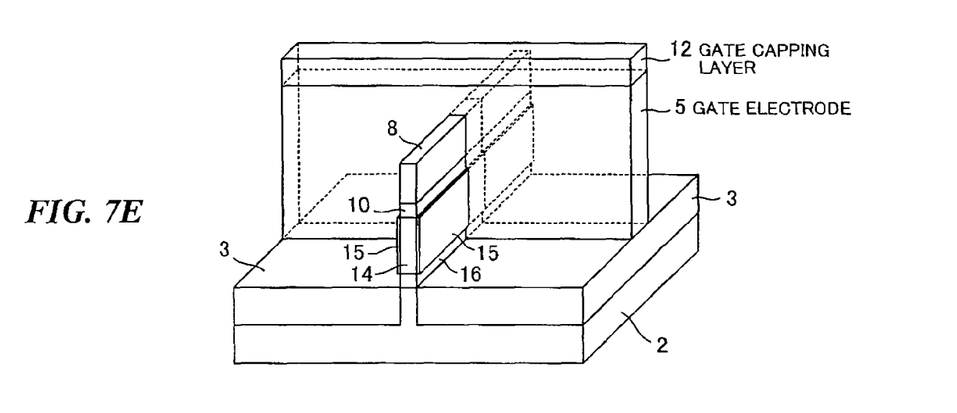

Next, as shown in FIG. 7E, the gate electrode 5 having the gate capping layer 12 on the upper surface thereof is formed.

Figure 7F:
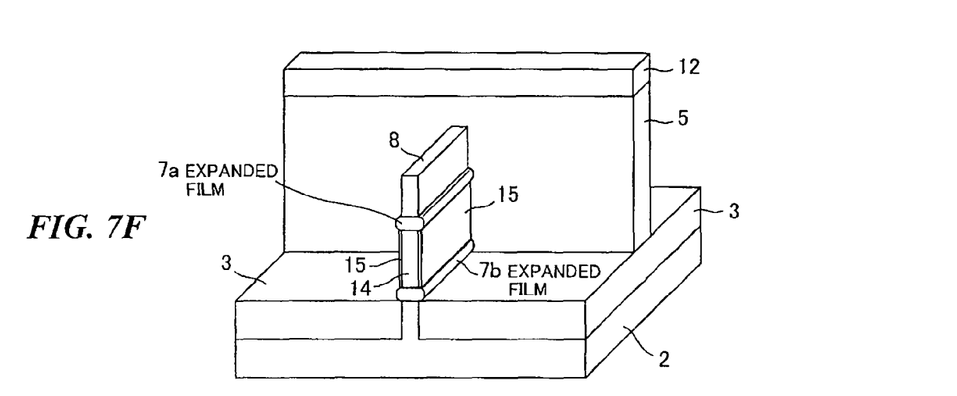

Next, as shown in FIG. 7F, the oxidation treatment is selectively applied to the first film 10 and the third film 16 for expanding the volume thereof, which results in that the expanded films 7a and 7b are formed.

Note that, similarly to the fin 4 according to the first embodiment, the fin 14 may be connected to a pad (not shown) which is a connection region of a contact plug connected to a source region and a drain region in the fin 14. In such cases, since a width of the upper surface of the pad contacting with the first film 10 and a width of the lower surface of the pad contacting with the third film 16 are larger than that of the fin 14, only the first film 10 located on the fin 14 and on the periphery of the pad as well as the third film 16 located under the fin 14 and under the periphery of the pad can be oxidized and processed into the expanded films 7a and 7b. Here, if the entire first film 10 and the entire third film 16 expand and become the expanded films 7a and 7b, all members above the expanded films 7a and 7b are lifted upward when the oxidation treatment is applied to the first film 10 and the third film 16 before forming the gate electrode 5, the force applied to the peripheral members is reduced. However, since the first film 10 located on the vicinity of the center of the upper surface of the pad and the third film 16 located under the vicinity of the center of the lower surface of the pad are not oxidized and do not expand, even when the expanded films 7a and 7b are formed before forming the gate electrode 5, the reduction of the force applied to the peripheral members by the expansion of the expanded films 7a and 7b can be suppressed, and it is thus possible to generate a strain in the fin 14 by the expanded films 7a and 7b.

Subsequent processes are same as the first embodiment.

According to the third embodiment, it is possible to apply the external force to the channel region in the fin 14 from upward and downward directions by each forming the expanded films 7a and 7b on and under the fin 14. Therefore, a compressive strain in a height direction of the fin 14 generated in the channel region of the n-type transistor 21 in the present embodiment is larger than a compressive strain in a height direction of the fin 4 generated in the channel region of the n-type transistor 1 in the first embodiment, and it is thus possible to further improve the operating speed of the transistor.

In addition, according to the third embodiment, since the fin 14 is insulated from the semiconductor substrate 2 by the expanded film 7b, it is not necessary to form a punchthrough stopper for suppressing source-drain leakage, thereby avoiding the increase in a channel impurity concentration. In other words, without using an expensive SOI substrate, it is possible to obtain the effect similar to the case of using the SOI substrate.

Alternatively, the n-type transistor 21 may be configured to form only the expanded film 7b without forming the expanded film 7a.

In such case, the expanding process may be provided after shaping the fin 4 and before forming the gate electrode 5. Furthermore, the cap layer 8 may be not provided on the fin 4.

In addition, it is possible to combine the present embodiment with the second embodiment. In detail, shrink films are formed on and under the fin 14 instead of forming the expanded films 7a and 7b, thus, a tensile strain in a height direction of the fin 14 can be generated in the channel region. As a result, hole mobility in the channel region is improved, hence, an operating speed of the p-type transistor is improved.

Fourth Embodiment

The fourth embodiment is different from the other embodiments in that a transistor has a tri-gate structure. Note that, the explanation will be omitted for the points same as the other embodiments.

(Structure of Semiconductor Device)

Figure 8A:
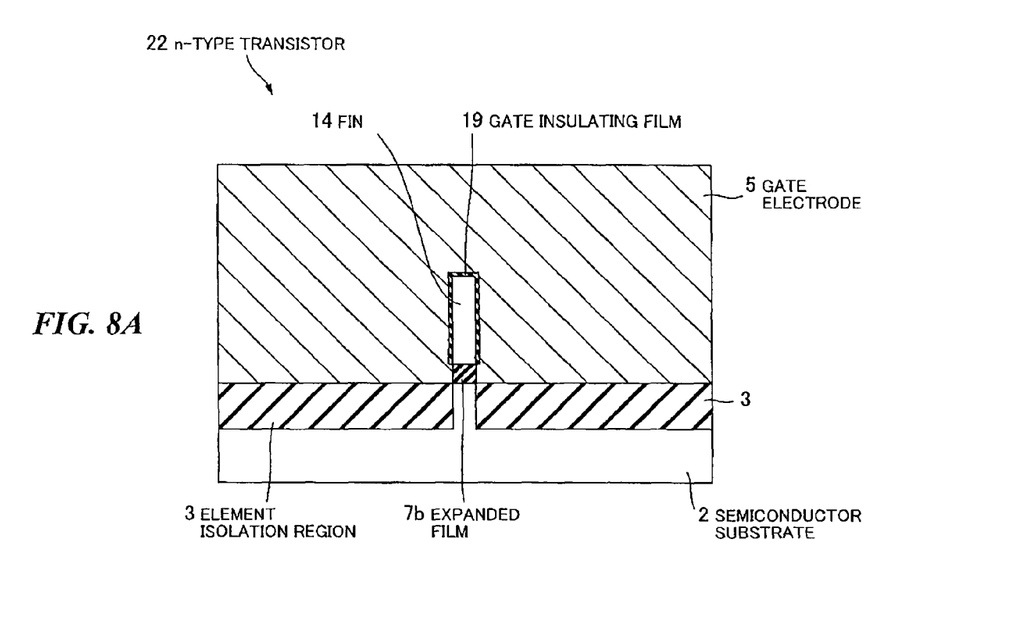
FIGS. 8A and 8B are perspective views showing processes for fabricating the semiconductor device according to the fourth embodiment.
Figure 8B:
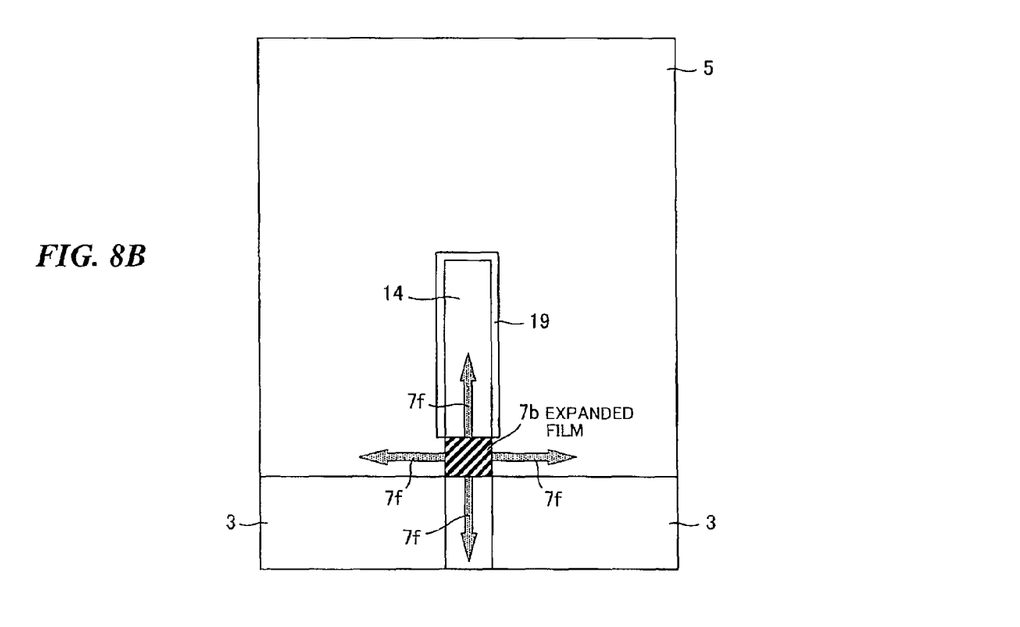

FIG. 8A is a cross sectional view showing a semiconductor device according to a fourth embodiment. In addition, FIG. 8B is a partial enlarged view of FIG. 8A. Note that, the cross sections shown in FIGS. 8A and 8B correspond to the cross sections of the semiconductor device according to the first embodiment shown in FIGS. 2A and 2B.

A semiconductor device according to the present embodiment has an n-type transistor 22 schematically configured to have a semiconductor substrate 2, an element isolation region 3, a fin 14 formed on the semiconductor substrate 2, a gate electrode 5 formed so as to sandwich both side faces of the fin 14 via gate insulating films 19, expanded films 7b formed under the fin 14, and offset spacers (not shown) formed on side faces of the gate electrode 5. The n-type transistor 22 has a tri-gate structure.

The gate insulating films 19 are formed on both side faces and an upper surface of the fin 14. In the n-type transistor 22, a region in the fin 14 in the vicinity of the both side faces and the upper surface of the fin 14, which is surrounded by the gate electrode 5 and is sandwiched by the source region and the drain region, functions as a channel region.

As shown in FIG. 8B, the expanded films 7b apply a pushing force 7f to peripheral members by the expansion thereof. As a result, the fin 14 receives an upward external force from the expanded film 7b, and a compressive strain in a height direction thereof is generated.

In addition, shrink films are formed under the fin 14 instead of forming the expanded films 7b, thus, a tensile strain in a height direction of the fin 14 can be generated in the channel region. As a result, hole mobility in the channel region is improved, hence, an operating speed of the p-type transistor is improved.

According to the fourth embodiment, similarly to a transistor having a double-gate structure in the first to third embodiment, it is possible to improve an operating speed of a transistor having a tri-gate structure.

Other Embodiments

It should be noted that the present invention is not intended to be limited to the above-mentioned first to fourth embodiments, and the various kinds of changes thereof can be implemented by those skilled in the art without departing from the gist of the invention.

Furthermore, it is possible to arbitrarily combine the configurations of the above-mentioned first to fourth embodiments without departing from the gist of the invention.

What is claimed is:

1. A semiconductor device, comprising:
   a fin formed on and extending-vertically from a semiconductor substrate and having a strain in a vertical direction in a channel region therein, the fin being composed of Si;
   gate insulating films formed vertically on opposed sides of said fin;
   a gate electrode formed so as to sandwich the gate insulating films on both side faces of a portion of the fin including the channel region; and
   a film formed at least either directly on or directly under a portion of the fin including the channel region, the film configured to generate a strain to the portion of the fin, the film comprising a SiGe oxide film or a Ge oxide film for generating a compressive strain in the vertical direction in the channel region of the fin, or a Si oxide film for generating a tensile strain in the vertical direction in the channel region of the fin,
   wherein the film is formed only between the gate insulating films at least either at a position covering the whole upper surface of the fin or a position covering the whole lower surface of the fin.

2. The semiconductor device according to claim 1, wherein the film is formed at least on the fin; and
   a cap layer is formed on the film on the fin.

3. The semiconductor device according to claim 2, wherein the film is formed by using oxidation treatment or heat treatment; and
   the oxidation treatment or the heat treatment is carried out after forming the cap layer.

4. The semiconductor device according to claim 1, wherein the fin is connected to a pad;
   the film is formed at least either on or under the fin and the pad; and
   a portion of the film including a center of a region contacting with the pad does not have a property of generating a strain in the fin.

5. The semiconductor device according to claim 4, wherein the film is formed at least on the tin and the pad; and
   a cap layer is formed on the film on the fin and the pad.

6. The semiconductor device according to claim 5, wherein the film is formed by using oxidation treatment or heat treatment; and
   the oxidation treatment or the heat treatment is carried out after forming the cap layer.

7. The semiconductor device according to claim 5, wherein the film is formed by using oxidation treatment or heat treatment; and
   the oxidation treatment or the heat treatment is carried out before forming the gate electrode.

8. The semiconductor device according to claim 4, wherein the film is formed by oxidation treatment of a $Si_{1-x}Ge^x$ ($0<x\leq1$) crystal.

9. The semiconductor device according to claim 8, wherein the oxidation treatment is carried out using burning oxidation.

10. The semiconductor device according to claim 8, wherein the oxidation treatment is carried out after forming the gate electrode.

11. The semiconductor device according to claim 4, wherein the film is formed by heat treatment of an ozone TEOS film.

12. The semiconductor device according to claim 11, wherein the heat treatment is carried out after forming the gate electrode.

13. The semiconductor device according to claim 4, wherein the film is formed by using oxidation treatment or heat treatment; and
the oxidation treatment or the heat treatment is carried out before forming the gate electrode.

14. The semiconductor device according to claim 1, wherein the film is formed by oxidation treatment of a $Si_{1-x}Ge_x$ ($0<x\leqq1$) crystal.

15. The semiconductor device according to claim 14, wherein the oxidation treatment is carried out using burning oxidation.

16. The semiconductor device according to claim 14, wherein the oxidation treatment is carried out after forming gate electrode.

17. The semiconductor device according to claim 1, wherein the film is formed by heat treatment of an ozone TEOS film.

18. The semiconductor device according to claim 17, wherein the heat treatment is carried out after forming the gate electrode.

* * * * *